(12) United States Patent
John et al.

(10) Patent No.: US 12,123,902 B2
(45) Date of Patent: Oct. 22, 2024

(54) ANTENNA ASSEMBLY HAVING A CIRCUIT BOARD AND AT LEAST ONE ANTENNA ARRANGED ON THE CIRCUIT BOARD

(71) Applicant: HELLA GmbH & Co. KGaA, Lippstadt (DE)

(72) Inventors: Andreas John, Lippstadt (DE); Henrik Salheiser, Soest (DE); Andreas Battray, Rheinberg (DE); Alessandro Vincente Ferrarotto, Lippstadt (DE)

(73) Assignee: Hella GmbH & Co. KGaA, Lippstadt (DE)

( * ) Notice: Subject to any disclaimer, the term of this patent is extended or adjusted under 35 U.S.C. 154(b) by 193 days.

(21) Appl. No.: 17/946,832

(22) Filed: Sep. 16, 2022

(65) Prior Publication Data
US 2023/0009783 A1 Jan. 12, 2023

Related U.S. Application Data

(63) Continuation of application No. PCT/EP2021/055145, filed on Mar. 2, 2021.

(30) Foreign Application Priority Data

Mar. 17, 2020 (DE) ...................... 10 2020 107 228.7

(51) Int. Cl.
*G01R 29/10* (2006.01)
*H01Q 1/12* (2006.01)
(Continued)

(52) U.S. Cl.
CPC ............... *G01R 29/10* (2013.01); *H01Q 1/12* (2013.01); *H01Q 9/0407* (2013.01);
(Continued)

(58) Field of Classification Search
CPC ........ G01R 29/00; G01R 29/08; G01R 29/10; H01Q 1/00; H01Q 1/12; H01Q 1/36;
(Continued)

(56) References Cited

U.S. PATENT DOCUMENTS

| 5,077,596 A | 12/1991 | Inoue | |
|---|---|---|---|
| 7,692,598 B1 * | 4/2010 | Hibbard | H01Q 9/44 343/700 MS |

(Continued)

FOREIGN PATENT DOCUMENTS

| CN | 101276960 A | * 10/2008 | ............... H01Q 9/42 |
|---|---|---|---|
| CN | 109942921 A | * 6/2019 | ............... C08L 11/00 |

OTHER PUBLICATIONS

International Search Report dated May 27, 2021 in corresponding application PCT/EP2021/055145.
(Continued)

*Primary Examiner* — Hoai-An D. Nguyen
(74) *Attorney, Agent, or Firm* — Muncy, Geissler, Olds & Lowe, P.C.

(57) ABSTRACT

An antenna assembly for a transceiver having first antennas arranged on a circuit board, a transmitting and receiving circuit arranged on the circuit board. The first antennas are connected to the transmitting and receiving circuit. Second antennas and terminating resistors are arranged on the circuit board. Each second antenna is connected to one of the terminating resistors by means of a strip line. At least one first contact for measuring HF properties of one of the second antennas and/or at least one second contact for measuring HF properties of the terminating resistor connected to the measurement antenna is arranged on the circuit board. The strip line between the measurement antenna and the terminating resistor is disconnectable at a disconnection point, and the strip line forms, on the side of the disconnection point nearest the measurement antenna, a third (Continued)

contact for measuring the HF properties of the measurement antenna.

10 Claims, 1 Drawing Sheet

(51) Int. Cl.
    *H01Q 9/04*     (2006.01)
    *H05K 1/02*     (2006.01)
    *H05K 1/11*     (2006.01)

(52) U.S. Cl.
    CPC ........... *H05K 1/0243* (2013.01); *H05K 1/115* (2013.01); *H05K 2201/10098* (2013.01)

(58) Field of Classification Search
    CPC .. H01Q 1/38; H01Q 3/00; H01Q 3/26; H01Q 3/267; H01Q 9/00; H01Q 9/04; H01Q 9/0407; H01Q 21/00; H01Q 21/06; H01P 1/00; H01P 1/04; H01P 1/047; H01P 1/24; H01P 1/26; H01P 1/268; H01P 5/00; H01P 5/02; H01P 5/022; H01P 5/028; H05K 1/00; H05K 1/02; H05K 1/0213; H05K 1/0237; H05K 1/0243; H05K 1/11; H05K 1/115; H05K 2201/00; H05K 2201/10; H05K 2201/10007; H05K 2201/10098
    USPC .................................................. 324/600, 629
    See application file for complete search history.

(56) References Cited

U.S. PATENT DOCUMENTS

| | | |
|---|---|---|
| 2018/0115084 A1 | 4/2018 | Tsuchiya et al. |
| 2018/0269919 A1 | 9/2018 | Gharavi et al. |

OTHER PUBLICATIONS

MPI Corporation: 'MPI Probe Selection Guide' Chu-pei City, 2017, pp. 1-14.

\* cited by examiner

ANTENNA ASSEMBLY HAVING A CIRCUIT BOARD AND AT LEAST ONE ANTENNA ARRANGED ON THE CIRCUIT BOARD

This nonprovisional application is a continuation of International Application No. PCT/EP2021/055145, which was filed on Mar. 2, 2021, and which claims priority to German Patent Application No. 10 2020 107 228.7, which was filed in Germany on Mar. 17, 2020, and which are both herein incorporated by reference.

BACKGROUND OF THE INVENTION

Field of the Invention

The present invention relates to an antenna assembly for a transceiver, comprising a circuit board, first antennas arranged on the circuit board, a transmitting and receiving circuit arranged on the circuit board, wherein the first antennas are connected to the transmitting and receiving circuit, comprising second antennas arranged on the circuit board, terminating resistors arranged on the circuit board, and wherein every second antenna is connected to one of the terminating resistors by means of a strip line, in particular by means of a microstrip line.

Description of the Background Art

Antenna assemblies, in which the antennas are arranged on circuit boards, are used in many areas of technology, such as radar technology or mobile communications technology. Such antenna assemblies have the advantage that they can be designed small and compact. Thus, a sensor in which the antenna assemblies are used or the circuit board on which they are arranged can be kept small and compact. The first antennas of the antenna assembly are used to send or receive electromagnetic signals. The second antennas, on the other hand, are not used for transmitting or receiving. The second antennas are so-called dummy antennas, which are used to improve the electromagnetic properties of the antenna assembly.

The first antennas or the antennas of the first type, which are connected to the transmitting and receiving circuit, are the active antennas (main antennas). The second antennas or the antennas of the second type are passive antennas (dummy antennas, auxiliary antennas), which are not used for transmitting and receiving in the intended use of the antenna assembly.

The dummy antennas are used to absorb high-frequency radiation, which is generated by the main antennas and is also transmitted to and into the circuit board in a disadvantageous manner, and ultimately to absorb it completely or at least partially via the terminating resistors by converting the HF radiation into heat there.

As is often the case with the manufacture of products of any kind, at least samples of antenna assemblies are taken from production so that they and their technical properties can be analyzed more precisely. Likewise, defective antenna assemblies are often considered more closely to determine the reason for the defect.

During the analyses, the high-frequency properties of the antenna assembly are often examined. It may be necessary to determine both the high-frequency properties of the antennas and the high-frequency properties of the terminating resistors. In order to determine the high-frequency properties of one of the antennas and one of the terminating resistors, it is necessary that the antenna and the terminating resistor connected to this antenna are disconnected from each other, i.e., that they are not connected to each other by means of a strip line.

A separate measurement of the high-frequency properties of the antenna and the terminating resistor could be made possible in an antenna assembly by arranging both the antenna and the terminating resistor twice on the circuit board, in a first version only for the measurement of the high-frequency properties, in which the antennas and the base resistance are not connected, and in a second version for the operation of the antenna assembly, where the antenna and the base impedance are connected. The first version is therefore only used for measuring and would be inoperable when operating the antenna assembly.

However, this solution is not only costly because the components or structures are provided twice, but also wasteful because the components or structures consume the area of the circuit board necessary for the assembly. This makes the antenna assembly larger than is necessary for operation.

Since there is little space available for the antenna assembly in many applications, the solution of using duplicate structures does not make sense.

SUMMARY OF THE INVENTION

It is therefore an object of the present invention to provide a more compact antenna assembly, which is produced in large quantities, in which it is possible to examine the high-frequency properties of the samples and defective assemblies in a simple manner.

This object is achieved according to an exemplary embodiment of the invention in that at least one first contact for measuring HF properties of one of the second antennas, hereinafter referred to as a measurement antenna, and/or at least a second contact for measuring HF properties of the terminating resistor connected to the measurement antenna are arranged on the circuit board and that the strip line, it may be in particular a microstrip line, between the measurement antenna and the terminating resistor is disconnectable at a disconnection point, and the strip line forms, on the side of the disconnection point nearest the measurement antenna, a third contact for measuring the HF properties of the measurement antenna and/or, on the side of the disconnection point nearest the terminating resistor, a fourth contact for measuring the HF properties of the terminating resistor.

According to the invention, one of the dummy antennas is used as a measurement antenna. On these measurement antennas, the HF properties of the identical or comparable first antennas (main antennas) can be detected by measurements. Likewise, the HF properties of the terminating resistor connected to the measurement antenna can be determined by way of example for all other terminating resistors. To measure the HF properties of the measurement antenna and/or the terminating resistor connected to the measurement antenna, the strip line is disconnected at the disconnection point. Then, to measure the HF properties of the measurement antenna, at least one of the first contacts and the third contact will be brought into contact with measuring tips of a measuring instrument. To measure the HF properties of the terminating resistor connected to the measurement antenna, one of the second contacts and the fourth contact are brought into contact with measuring tips of a measuring instrument.

Indirectly measuring the HF properties of the main antennas according to the invention by measuring the identical or comparable dummy antennas is advantageous as compared to measuring using the main antennas because the main antennas do not need to have any additional metallization for the formation of measuring contacts, which would adversely affect the HF properties of the main antennas.

Since the dummy antennas are manufactured in the same manufacturing process and with the same manufacturing parameters as the main antennas, the HF properties of the dummy antennas are transferable to those of the main antennas and thus comparable.

A terminating resistor for the purposes of the invention means any type of HF waveguide absorber in which the HF radiation is converted into heat via ohmic and/or dielectric losses and thus absorbed. The terminating resistor can be designed as a separate component. However, it is also possible that the terminating resistor is not designed as a separate component, e.g., is formed by the end of the strip line, which is laid into the lossy circuit board.

By separating the strip line between the measurement antenna and the connected terminating resistor, the HF properties of the measurement antenna and the assigned measuring resistor can be measured. However, as a result the properties of the antenna assembly as a whole are changed in such a way that the antenna can no longer be used. However, since the measurements and the disconnection are only carried out in the case of random samples or defective antenna assemblies, the effects of the failure of the antenna assemblies used for measuring are less than the effects that would occur if each antenna assembly, as described above, were provided with special measuring structures.

The at least one first contact and the third contact of an antenna assembly according to the invention can form a measuring connection for measuring the HF properties of the measurement antenna. The at least one second contact and the fourth contact can form a measuring connection for measuring the HF properties of the terminating resistor connected to the measurement antenna.

The antenna assembly according to the invention with a test structure saves space on the circuit board and thus costs. Another advantage is that a direct measurement method is possible.

For the correct functioning of a radar sensor, for example, the frequency position of the antennas of the antenna assembly is of great importance.

The characteristics of the circuit board of an antenna assembly, which have the greatest influence on the frequency position of the antennas, are: the dimensions of the copper structures, the dielectric number of the substrate, the thickness of the substrate, the roughness of the copper, and/or the dimensions of the copper structures can usually be determined non-destructively.

The thickness of the substrate and the roughness of the copper are usually measured in micrographs. The dielectric number of the substrate can be determined with test structures such as microstrip lines or ring resonators, if the other three parameters are known. With the antenna assembly according to the invention and the measurement method according to the invention, the frequency position of the antennas can be determined directly without having to determine the four parameters mentioned above.

The antennas can be patch antennas.

All first and all second antennas can have the same antenna geometry. The first and second antennas do not have to have the same antenna geometry to be able to see in the measurement result whether there is a frequency shift or not. However, it is advantageous to design the first and second antennas the same, as the measured values of the second antennas can then be transferred to those of the first antennas without having to convert.

The strip line between the measurement antenna and the terminating resistor connected to the measurement antenna may be narrower in an antenna assembly according to the invention in the area of the disconnection point and the first and second contacts than in the adjoining areas of the strip line that lead to the terminating resistor or to the measurement antenna. Due to the narrow design of the strip line in the area of the disconnection point and the first and second contacts, it is possible to place measuring tips of a known measuring instrument on the first and second contacts and on the third and fourth contacts resulting from the disconnection of the strip line. However, the narrow design of the strip line changes the properties of the measurement antenna compared to the other antennas of the antenna assembly. In particular, the impedance can change. These effects of the narrow design of the strip line can be counteracted by further changes.

The strip line may be covered with a solder resist between the measurement antenna and the terminating resistor connected to the measurement antenna in the area of the disconnection point and the first and second contacts. The impedance of the measurement antenna can be influenced by the solder resist between the strip line and a substrate of the circuit board. This can counteract the effects of the narrow strip line. However, the influence on the impedance alone is usually not sufficient to compensate for the effects of the narrow strip line. Therefore, further measures can be taken to bring about compensation. One of these measures will be explained later.

In an antenna assembly according to the invention, in each case a first contact and a second contact can be arranged on a first side and in each case a first contact and a second contact can be arranged on a second side of the strip line between the measurement antenna and the terminating resistor connected to the measurement antenna, in the area of the disconnection point. The assembly of the contacts can thus correspond to a measuring tip of a known measuring instrument. Due to the fact that a first (measuring) contact and a second (measuring) contact are arranged on both sides of the strip line, i.e., two first and two second (measuring) contacts symmetrically to the strip line, the measurement of the HF properties of the measurement antenna or the terminating resistor is particularly good, since the HF radiation spreads symmetrically to both sides of the strip line.

The circuit board of an antenna assembly according to the invention may be an HDI circuit board. The first contacts and the second contacts can be connected to microvias. Microvias may be arranged between the first and second contact on the first side of the strip line and between the first and the second contact on the second side of the strip line. By means of these microvias, the impedance can be influenced in such a way that the impedance effects of the narrow strip line are compensated.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
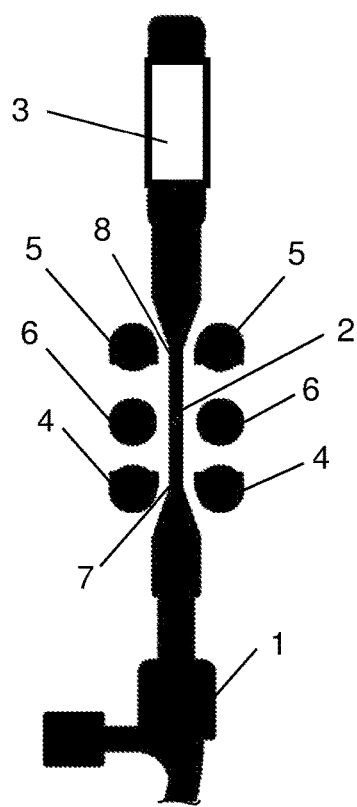
FIG. 1 shows a structure with part of a measurement antenna, a terminating resistor connected to the measurement antenna and a strip line between the measurement antenna and the terminating resistor.
Figure 2:
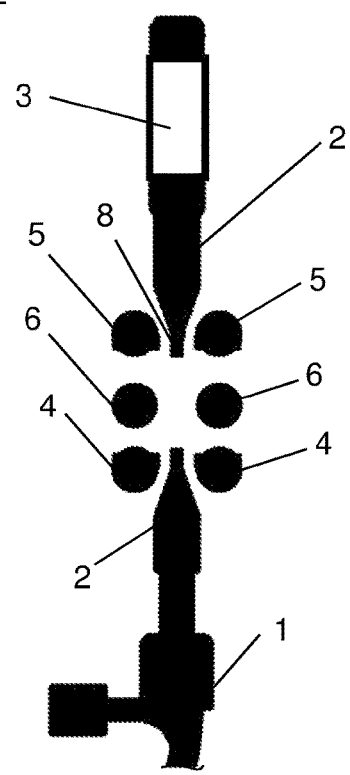
FIG. 2 shows the structure from FIG. 1, however, with a disconnected strip line between the measurement antenna and the terminating resistor.

The structure of an antenna assembly according to the invention is arranged on a circuit board and has the measurement antenna 1, of which only one end is represented with an antenna patch. The rest of the measurement antenna adjoins the displayed end. The measurement antenna 1 is connected to the terminating resistor 3 by means of the strip line 2. The strip line 2 has a constriction in which the strip line 2 is narrower than in the adjoining areas of the strip line 2, which lead to the measurement antenna 1 or to the terminating resistor 3.

Three microvias are provided on both sides of the constriction. Mutually opposite microvias are connected to each other in a not-shown layer of the circuit board. The two microvias closest to the measurement antenna 1 are connected on the one hand to the first contact 4 or the first contacts 4 and on the other hand to an HF ground. The contacts 4 are designed in such a way that there is a sufficient contact surface for contacting with measuring tips of a measuring instrument. The two microvias closest to the terminating resistor 3 are connected on the one hand to the second contact 5 or the second contacts 5 and on the other hand to the HF ground. Contacts 5 are also designed in such a way that there is a sufficient contact surface for contacting with measuring tips of a measuring instrument. The microvias 6 located in the middle in between are intended to match the impedance of the strip line 2.

According to the method of the invention, the strip line 2 is disconnected to measure the HF properties of the measurement antenna 1 or the terminating resistor 3. The ends of the strip line at the disconnection point form the third contact 7 and the fourth contact 8. The end of the strip line 2 leading to the measurement antenna 1 forms the third contact 7. This third contact 7 can be contacted together with the first contacts 4 of measuring tips of a measuring instrument to record the HF properties of the measurement antenna. The fourth contact 8 can be contacted together with the second contacts 5 of measuring tips of a measuring instrument to detect the HF properties of the terminating resistor 3.

Although the contacts 4,5 arranged on the side of the strip line 2 are potentially connected to each other with an HF ground layer within the circuit board, it is advantageous if
  a) for the determination of the properties of the measurement antenna, in addition to the contact 7 on the strip line, the closest contact to the measurement antenna 4 is used,
  b) for the determination of the properties of the terminating resistor, in addition to the contact 8 on the strip line, the closest contact 5 to the terminating resistor is used.

The measuring instrument can be the measuring instrument from the TITAN probe series of the MPI Corporation and the measuring tip "MEMS coplanar contact tip", as described and presented in the document MPI Probe Selection Guide, which is incorporated herein by reference.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. An antenna assembly for a transceiver, the antenna assembly comprising:
    a circuit board;
    first antennas arranged on the circuit board;
    a transmitting and receiving circuit arranged on the circuit board, the first antennas being connected to the transmitting and receiving circuit;
    second antennas arranged on the circuit board;
    terminating resistors arranged on the circuit board, each second antenna being connected to one of the terminating resistors via a strip line; and
    at least one first contact to measure HF properties of one of the second antennas, a second antennas being a measurement antenna, and/or at least one second contact for measuring HF properties of the terminating resistor connected to the measurement antenna is arranged on the circuit board,
    wherein the strip line between the measurement antenna and the terminating resistor is disconnectable at a disconnection point, and the strip line forms, on a side of the disconnection point nearest the measurement antenna, a third contact for measuring the HF properties of the measurement antenna and/or, on the side of the disconnection point nearest the terminating resistor, a fourth contact for measuring the HF properties of the terminating resistor.

2. The antenna assembly according to claim 1, wherein the antennas are patch antennas.

3. The antenna assembly according to claim 1, wherein the at least one first contact and the third contact is a measuring connection for measuring the HF properties of the measurement antenna.

4. The antenna assembly according to claim 1, wherein the at least one second contact and the fourth contact is a measuring connection for measuring the HF properties of the terminating resistor connected to the measurement antenna.

5. The antenna assembly according to claim 1, wherein the strip line between the measurement antenna and the terminating resistor connected to the measurement antenna in the area of the disconnection point and the first contacts and second contacts is narrower than in adjoining areas.

6. The antenna assembly according to claim 1, wherein the strip line between the measurement antenna and the terminating resistor connected to the measurement antenna in the area of the disconnection point and the first contacts and second contacts is covered with a solder resist.

7. The antenna assembly according to claim 1, wherein a first contact and a second contact on a first side, and a first contact and a second contact on a second side of the strip line are arranged in the area of the disconnection point between the measurement antenna and the terminating resistor connected to the measurement antenna.

8. The antenna assembly according to claim 7, wherein the first contacts and the second contacts are connected to microvias.

9. The antenna assembly according to claim 7, wherein microvias are arranged between the first contact and the second contact on the first side of the strip line, and between the first contact and the second contact on the second side of the strip line.

10. A method for measuring HF properties of a measurement antenna and/or a terminating resistor connected to the measurement antenna of an antenna assembly according to claim 1, the method comprising:
- disconnecting the disconnection point to measure the HF properties of the measurement antenna and/or the terminating resistor of the strip line connected to the measurement antenna; and
- bringing at least one of the first contacts and the third contact into contact with measuring tips of a measuring instrument for measuring the HF properties of the measurement antenna and/or then, in order to measure the HF properties of the terminating resistor connected to the measurement antenna, one of the second contacts and the fourth contact are brought into contact with measuring tips of a measuring instrument.

* * * * *